United States Patent
Yoshida et al.

(10) Patent No.: US 10,707,146 B2
(45) Date of Patent: Jul. 7, 2020

(54) SEMICONDUCTOR DEVICE AND METHOD FOR MANUFACTURING SAME, FOR RELEAVED STRESS AND HIGH HEAT CONDUCTIVITY

(71) Applicant: Mitsubishi Electric Corporation, Chiyoda-ku (JP)

(72) Inventors: Motoru Yoshida, Tokyo (JP); Yoshiyuki Suehiro, Tokyo (JP); Kazuyuki Sugahara, Tokyo (JP); Yosuke Nakanishi, Tokyo (JP); Yoshinori Yokoyama, Tokyo (JP); Shinnosuke Soda, Tokyo (JP); Komei Hayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/088,532

(22) PCT Filed: Oct. 31, 2016

(86) PCT No.: PCT/JP2016/082199
§ 371 (c)(1),
(2) Date: Sep. 26, 2018

(87) PCT Pub. No.: WO2017/183222
PCT Pub. Date: Oct. 26, 2017

(65) Prior Publication Data
US 2019/0122955 A1    Apr. 25, 2019

(30) Foreign Application Priority Data

Apr. 21, 2016    (JP) .................................. 2016-085068

(51) Int. Cl.
*H01L 23/40*    (2006.01)
*H01L 25/18*    (2006.01)
(Continued)

(52) U.S. Cl.
CPC .............. *H01L 23/40* (2013.01); *H01L 21/52* (2013.01); *H01L 21/56* (2013.01);
(Continued)

(58) Field of Classification Search
CPC ..... H01L 23/40; H01L 23/3736; H01L 21/52; H01L 21/56; H01L 25/07; H01L 25/18; H01L 2224/32225
(Continued)

(56) References Cited

U.S. PATENT DOCUMENTS

2001/0033016 A1    10/2001    Sumikawa et al.
2006/0249853 A1    11/2006    Sumikawa et al.
(Continued)

FOREIGN PATENT DOCUMENTS

JP    2001-230224 A    8/2001
JP    2013-168431 A    8/2013
(Continued)

OTHER PUBLICATIONS

International Search Report dated Dec. 20, 2016 in PCT/JP2016/082199 filed Oct. 31, 2016.

*Primary Examiner* — Lex H Malsawma
*Assistant Examiner* — Eric W Jones
(74) *Attorney, Agent, or Firm* — Xsensus LLP (57) ABSTRACT

Provided is a semiconductor device having high heat conductivity and high productivity. A semiconductor device includes an insulating substrate, a semiconductor element, a die-bond material, a joining material, and a cooler. The insulating substrate has an insulating ceramic, a first conductive plates disposed on one surface of the insulating ceramic, and a second conductive plate disposed on another surface of the insulating ceramic. The semiconductor element is disposed on the first conductive plate through the die-bond material. The die-bond material contains sintered (Continued)

metal. The semiconductor element has a bending strength degree of 700 MPa or more, and has a thickness of 0.05 mm or more and 0.1 mm or less. The cooler is joined to the second conductive plate through the joining material.

12 Claims, 9 Drawing Sheets

(51) Int. Cl.
*H01L 21/52* (2006.01)
*H01L 25/07* (2006.01)
*H01L 21/56* (2006.01)
*H01L 23/373* (2006.01)

(52) U.S. Cl.
CPC .......... *H01L 23/3736* (2013.01); *H01L 25/07* (2013.01); *H01L 25/18* (2013.01); *H01L 2224/32225* (2013.01)

(58) Field of Classification Search
USPC .......................................................... 257/77
See application file for complete search history.

(56) References Cited

U.S. PATENT DOCUMENTS

| | | | |
|---|---|---|---|
| 2011/0074010 A1* | 3/2011 | Kuromitsu | H01L 23/3735 257/703 |
| 2013/0328184 A1* | 12/2013 | Iwayama | C04B 41/009 257/712 |
| 2015/0021750 A1* | 1/2015 | Fujino | H01L 23/24 257/667 |
| 2015/0035137 A1 | 2/2015 | Nishimoto et al. | |
| 2015/0099428 A1* | 4/2015 | Fujita | B24D 5/12 451/28 |
| 2015/0107572 A1* | 4/2015 | Fujita | B24D 5/12 125/15 |
| 2016/0322274 A1* | 11/2016 | Takizawa | H01L 23/12 |
| 2017/0317048 A1* | 11/2017 | Matsubara | H01L 24/29 |

FOREIGN PATENT DOCUMENTS

| | | |
|---|---|---|
| JP | 2013-207116 A | 10/2013 |
| JP | 2014-103182 A | 6/2014 |
| JP | 2015-15412 A | 1/2015 |
| JP | 2015-50228 A | 3/2015 |
| JP | 2015-170785 A | 9/2015 |

* cited by examiner

SEMICONDUCTOR DEVICE AND METHOD FOR MANUFACTURING SAME, FOR RELEAVED STRESS AND HIGH HEAT CONDUCTIVITY

TECHNICAL FIELD

The present invention relates to semiconductor devices and methods for manufacturing the same.

BACKGROUND ART

In semiconductor devices serving as power modules, semiconductor elements made of, for instance, silicon (Si) or silicon carbide (SiC) are used. Heat from such a semiconductor element, whose temperature needs to be kept at or below a predetermined temperature, should be efficiently dissipated.

In view of heat dissipation, a power module has been conventionally proposed that includes a cooler joined to the semiconductor element with an insulating substrate interposed therebetween. The insulating substrate has a one-piece structure composed of an insulating ceramic plate having high heat conductivity and conductive plates of metal having high heat conductivity disposed on both surfaces of the insulating ceramic plate. The insulating ceramic plate is made of, for instance, silicon nitride, aluminum nitride, or alumina. The conductive plate is made of, for instance, aluminum (including an alloy of aluminum, and so forth) or copper (including an alloy of copper, and so forth).

The semiconductor element is joined to one surface of the insulating substrate with a sintered metal, such as sintered Ag, interposed therebetween. The cooler is directly or indirectly joined to the other surface of the insulating substrate with a joining material, such as solder, interposed therebetween.

Meanwhile, semiconductor elements have been proposed in order to reduce the deformation of a resin that seals the semiconductor device. This deformation results from temperature changes in the external environment for instance. For instance, a semiconductor element having a bending strength degree of 100 MPa or more and 1000 Mpa or less is provided as a stress reliever.

A stress reliever in Patent Document 1 is composed of a semiconductor element disposed on a main surface of an insulating substrate and having a bending strength degree of 100 MPa or more and 1000 Mpa or less.

PRIOR ART DOCUMENT

Patent Document

Patent Document 1: Japanese Patent Application Laid-Open No. 2015-15412

SUMMARY

Problem to be Solved by the Invention

The aforementioned configuration, even proposed in view of heat dissipation, can fail to maintain sufficient heat dissipation performance in a required period of lifetime. Such a failure is caused by thermal stress produced in some conditions for use, with a difference in thermal expansion coefficient between the semiconductor element and the cooler, and by cracking in the semiconductor element or the joining material between the semiconductor element and the cooler due to the thermal stress.

For instance, Patent Document 1 discloses a semiconductor device including the stress reliever. This semiconductor device has a problem in a direct cooling module including a cooler and the insulating substrate directly joined to each other with solder. The insulating substrate is provided with a Ag-sintered portion joined to the semiconductor element (e.g., a SiC chip). Commonly, SiC is desirably resistant to a junction temperature higher than that of Si. Heat cycles of repeating high temperature and low temperature involve a temperature of 175° C. or more at the time of high temperature. The Ag-sintered portion can have cracking when operating in such heat cycles.

To solve this problem, it is an object of the present invention to provide a semiconductor device having high heat conductivity and high productivity, and to provide a method for manufacturing the semiconductor device.

Means to Solve the Problem

A semiconductor device according to the present invention includes an insulating substrate having an insulating plate, a first conductive plate disposed on one surface of the insulating plate, and a second conductive plate disposed on the other surface of the insulating plate. Further, the semiconductor device includes the following: a sintered metal; a semiconductor element disposed on the first conductive plate through the sintered metal, the semiconductor element having a thickness of 0.05 mm or more and 0.1 mm or less; a joining material; and a cooler joined to the second conductive plate through the joining material. The semiconductor element has a crack-proceeding depth rate of 30% or less of a chip thickness.

A method for manufacturing a semiconductor device according to the present invention includes the following steps: (a) preparing an insulating substrate having an insulating plate, a first conductive plate disposed on one surface of the insulating plate, and a second conductive plate disposed on the other surface of the insulating plate; (b) disposing a semiconductor element to the first conductive plate through a sintered metal; and (c) joining a cooler to the second conductive plate through a first joining material. The semiconductor element has a thickness of 0.05 mm or more and 0.1 mm or less, and has a crack-proceeding depth rate of 30% or less of the thickness.

Effects of the Invention

The semiconductor device according to the present invention absorbs, in the semiconductor element, thermal stress resulting from a difference between the linear expansion coefficient of the semiconductor element and the thermal expansion coefficient of the cooler. This relieves stress generated in the joining material and achieves high productivity while achieving high heat conductivity. The method for manufacturing a semiconductor device according to the present invention contributes to the manufacture of the semiconductor device according to the present invention.

These and other objects, features, aspects and advantages of the present invention will become more apparent from the following detailed description when taken in conjunction with the accompanying drawings.

DESCRIPTION OF EMBODIMENT(S)

First Embodiment

Figure 1:
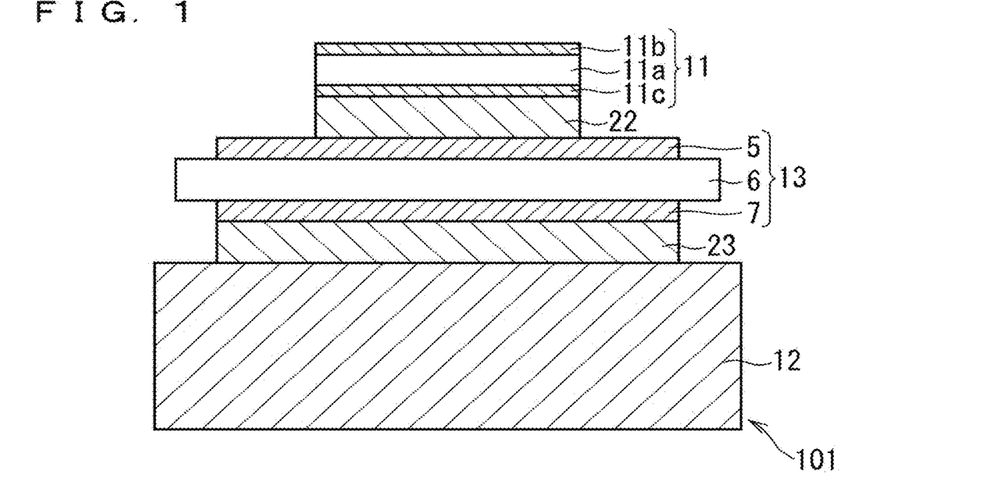
FIG. 1 is a cross-sectional view of the structure of a semiconductor device according to a first embodiment.
Figure 2:
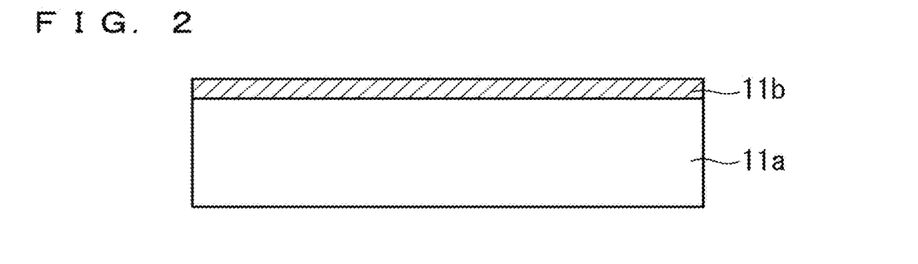
FIGS. 2 to 5 are cross-sectional views of one of sequential steps for manufacturing a semiconductor element.

FIG. 1 is a cross-sectional view of the structure of a semiconductor device 101 according to a first embodiment. The semiconductor device 101 includes a semiconductor element 11, a die-bond material 22, an insulating substrate 13, a joining material 23, and a cooler 12.

The semiconductor element 11 is joined to one surface of the insulating substrate 13 through the die-bond material 22. The cooler 12 is joined to the other surface of the insulating substrate 13 through the joining material 23. The insulating substrate 13 has an insulating ceramic 6, which acts as an insulating plate, a conductive plate 5 disposed on one surface of the insulating ceramic 6, and a conductive plate 7 disposed on the other surface of the insulating ceramic 6. In other words, the insulating substrate 13 has the conductive plates 5 and 7, and the insulating ceramic 6 sandwiched between the conductive plate 5 and the conductive plate 7. These components are previously integrated with a material, such as wax, to constitute the insulating substrate 13.

The conductive plate 5 is in contact with the die-bond material 22. Thus, the semiconductor element 11 is disposed on the conductive plate 5 through the die-bond material 22, and more specifically, is joined to the conductive plate 5. It is noted that the semiconductor element 11 may be joined to the insulating substrate 13 through a direct joining process, such as Cu-solid-phase diffusion bonding or ultrasonic bonding, without the die-bond material 22. The conductive plate 7 faces the cooler 12, and is joined to the cooler 12 through the joining material 23.

The semiconductor element 11 has a semiconductor base 11a and a wiring electrode 11b electrically connected to the semiconductor base 11a. The semiconductor element 11 further has a back-surface external-output electrode 11c on a surface of the semiconductor element 11 (hereinafter referred to as a "second main surface") that is opposite to a surface (hereinafter referred to as a "first main surface") provided with the wiring electrode 11b (the second surface is in the lower part in the drawing).

The semiconductor base 11a is made of SiC for instance. SiC is a so-called wide-bandgap semiconductor. Using a wide-bandgap semiconductor, which has wider bandgap than Si, as the semiconductor base 11a is advantageous to increase the electric field strength of the semiconductor element 11 against dielectric breakdown and to operate the semiconductor element 11 at a high temperature of 175° C. or more. The following describes a case where the semiconductor base 11a is made of SiC.

The wiring electrode 11b is formed of, for instance, a metal layer containing one of Cu, Al, AlSi, Ni, and Au, or a combination of these metal layers. In the present embodiment, the back-surface external-output electrode 11c is formed of, for instance, a metal layer containing one of Al, AlSi, Ni, and Au, or a combination of these metal layers.

The die-bond material 22 can be made of, for instance, a low-temperature sintered material containing silver nanoparticles, a liquid phase diffusion bonding material (such as Cu—Sn or Ag—Sn), or a joining material that is a good electric and heat conductor, such as solder. The following describes a case where the die-bond material 22 is made of sintered metal. An example of the sintered metal is sintered Ag.

The semiconductor element 11 absorbs thermal stress generated by a difference in thermal expansion coefficient between the semiconductor element 11 and the cooler 12 in a heat cycle test. When the semiconductor device 101 warps in whole, the die-bond material 22 also warps and thus has stress. The die-bond material 22 needs to be resistant to this stress.

The die-bond material 22, when having a thickness of less than 3 μm, has no resistance to such stress generated in the heat cycle test, thus having cracking. The die-bond material 22 having a thickness of less than 3 μm thus has insufficient strength. The die-bond material 22, when having a thickness of more than 100 μm, possibly has cracking in its formation processes. Accordingly, the die-bond material 22 desirably has a thickness of 3 μm or more in order to have sufficient strength, and desirably has a thickness of 100 μm or less in order to prevent cracking in its formation processes.

The conductive plates 5 and 7 each can be formed of, for instance, a conductor, such as copper or aluminum. The conductive plates 5 and 7, when made of copper, each have a thickness of 0.2 to 1.0 mm and a linear expansion coefficient of 17 ppm for instance.

The insulating ceramic 6 can be formed of a ceramic of, for instance, silicon nitride, aluminum nitride, or alumina, that is an electrical insulator and a good heat conductor. The insulating ceramic 6, when made of silicon nitride, has a thickness of 0.1 to 1.00 mm and a linear expansion coefficient of 2.5 ppm, for instance. The insulating substrate 13, as a whole, including the conductive plates 5 and 7 presumably has a linear expansion coefficient of 5.7 to 8.9 ppm for instance.

The joining material 23 can be made of, for instance, a low-temperature sintered material containing silver nanoparticles, a liquid phase diffusion bonding material (such as Cu—Sn or Ag—Sn), or a joining material that is a good heat conductor, such as solder. For solder joining, the yield stress of a solder material is desirably reflected, and high-strength solder, such as Sn—Cu—Sb, is preferably used.

The cooler 12 is made of a metal material having well thermal conductivity, such as copper or aluminum.

Such a configuration provides a small heat resistance from the semiconductor element 11 to the cooler 12. Thus, thanks to high heat-transfer performance, heat generated from the semiconductor element 11 is transferred to the cooler 12. Moreover, plastic deformation of the semiconductor element 11 absorbs most of the thermal stress, resulting from the difference in thermal expansion coefficient between the semiconductor element 11 and the cooler 12. This sufficiently enhances the reliability of a joint between the insulating substrate 13 and the cooler 12.

With reference to FIGS. 2 to 5, the following simply illustrates steps for manufacturing the semiconductor element 11, and particularly, steps for manufacturing the semiconductor element 11 having a thickness t of 100 μm or less. FIGS. 2 to 5 are cross-sectional views of sequential steps for manufacturing the semiconductor element 11. At first, a device surface is formed onto the first main surface. The device surface is a source surface in a MOSFET for instance. The wiring electrode 11b is formed in this step (c.f., FIG. 2).

Figure 3:
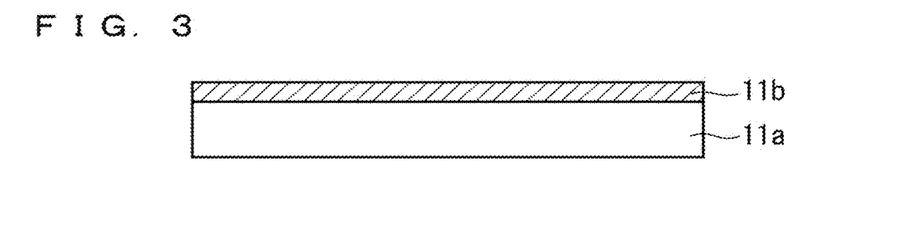

Next, the second main surface undergoes grinding, so that the semiconductor base 11a has a thickness of 50 μm or more and 100 μm or less for instance. The grinding is performed by, for instance, a grinder using a grindstone containing vitrified bonded diamond abrasive grains. In the grinding, the first main surface of the semiconductor base 11a undergoes protective tape attachment to protect the device surface from the grinding. Alternatively, the first main surface may undergo wax application or other kinds of application, followed by support-substrate attachment to protect the device surface.

Figure 4:
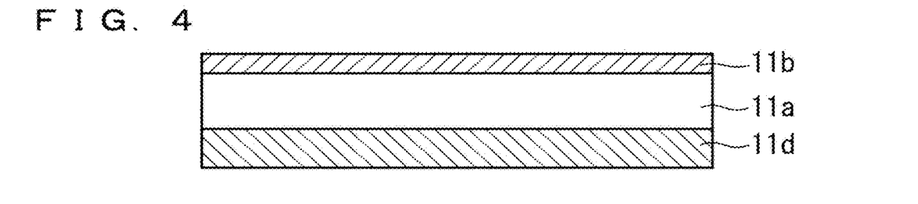

After the grinding, a metal film 11d is deposited for forming a silicide onto the second main surface. The metal film 11d is made of Ni for instance. Next, the metal film 11d undergoes reacting with the semiconductor base 11a to form a silicide layer, and a contact electrode is formed. Such a reaction is performed through laser light irradiation to the metal film 11d.

Next, a surface of the contact electrode undergoes etching to remove an oxide film and other things on the surface. The etching is performed through dry-etching with $Ar^+$ ions for instance. At this time, part of the metal film 11d may remain unreacted.

Figure 5:
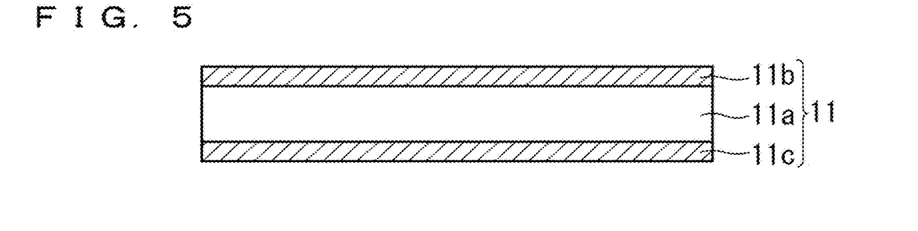

After the removal of the oxide film on the surface, formed is the back-surface external-output electrode 11c onto the surface of the contact electrode (FIG. 5). For simple illustration, the contact electrode is not shown in the drawing. How to form the back-surface external-output electrode 11c considerably affects its adhesion. In the present embodiment, the back-surface external-output electrode 11c is formed through DC sputtering. Electric power applied at this time provides a deposition temperature of 100° C. or more.

Typically, a plurality of semiconductor elements 11 are produced on the same semiconductor wafer. As such, FIGS. 2 to 5 illustrate steps for producing one of the plurality of semiconductor elements 11 produced in parallel. The semiconductor wafer serves as the semiconductor base 11a of the plurality of semiconductor elements 11. Immediately after being produced, the plurality of semiconductor elements 11 are coupled to each other with the semiconductor base 11a interposed therebetween. Accordingly, the coupled semiconductor elements 11 undergo dicing into separate pieces.

Figure 6:
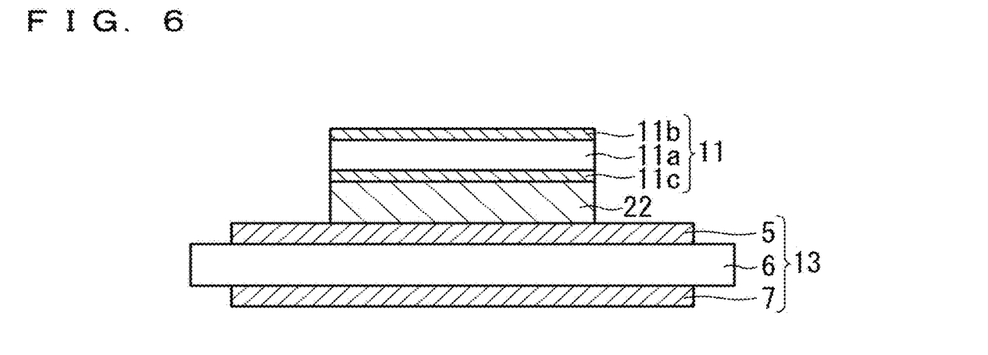
FIG. 6 is a cross-sectional view of a step after the manufacture of the semiconductor element and before the formation of the semiconductor device.

FIG. 6 is a cross-sectional view of a step after the production of each semiconductor element 11 and before the completion of the semiconductor device 101. Prepared is the insulating substrate 13, which is, as mentioned above, formed of the conductive plates 5 and 7 and the insulating ceramic 6 as previously integrated with each other. Then, through the die-bond material 22, the semiconductor element 11 is joined to the conductive plate 5 on the second main surface. The cooler 12 is joined to the conductive plate 7 through the joining material 23. As mentioned above, the semiconductor device 101 is manufactured (FIG. 1). That is, these manufacturing steps contribute to the manufacture of the semiconductor device 101.

In a heat cycle test, a difference in linear expansion coefficient between the cooler 12, which is a good heat conductor, and the insulating substrate 13 and the semiconductor element 11 commonly produces warping in the semiconductor device 101. Accordingly, greater warping makes greater stress generated in the die-bond material 22.

In a direct-cooling module structure in the present embodiment, the cooler 12 is directly connected to the joining material 23, an example of which is solder. Moreover, the cooler 12 is joined to the insulating substrate 13 including the semiconductor element 11 as die-bonded, through the joining material 23. Hence, the difference in linear expansion coefficient between the cooler 12, and the insulating substrate 13 and the semiconductor element 11 is likely to produce warping.

In a typical module structure, a base plate of copper (not shown) is joined to the cooler 12 through grease. The base plate is further joined to the insulating substrate 13 including the semiconductor element 11 as die-bonded through a joining material, such as solder. As such, the grease and the base plate relieve the warping, resulting from the difference in linear expansion coefficient between the cooler 12, and the insulating substrate 13 and the semiconductor element 11, thereby relieving the warping when compared to a direct-cooling module structure. In other words, the die-bond material 22 has small stress.

The following describes calculation to obtain a desirable linear expansion coefficient of the insulating substrate 13 for reduced stress in the die-bond material 22.

Figure 7:
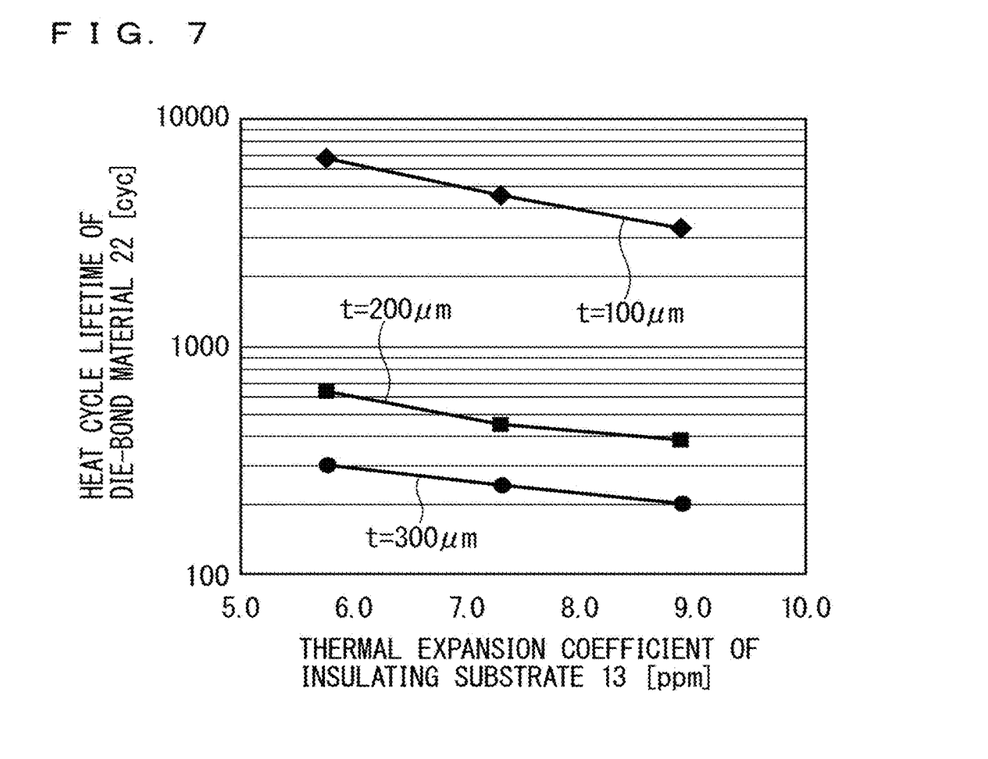

FIG. 7 illustrate graphs showing lifetime relationships of the die-bond material 22 with linear expansion coefficients of the insulating substrate 13 as a whole, which is joined to the semiconductor element 11 through the die-bond material 22. The graphs employ the thickness, t, of the semiconductor element 11 as a parameter in the relationships, and provide instances where its values are 100 μm, 200 μm, and 300 μm. It is noted that these graphs are the results of analysis performed by computer aided engineering (CAE). Sintered Ag is used as the die-bond material 22. The insulating substrate 13 is joined to the semiconductor element 11 through the die-bond material 22. The cooler 12 is joined to the insulating substrate 13 through the joining material 23.

A horizontal axis in FIG. 7 denotes the linear expansion coefficient of the insulating substrate 13 as a whole (the drawing only expresses "linear expansion coefficient of insulating substrate 13", and so forth) in the unit ppm. A vertical axis in FIG. 7 denotes the lifetime of the die-bond material 22, that is, the number of cycles performed until the die-bond material 22 fails in a heat cycle test. The heat cycle test herein is a temperature cycle test in which the temperature of the external environment of the semiconductor device 101 is changed from –(minus) 40° C. through 175° C. to, again, –(minus) 40° C.

In the following description, the cooler 12 used in the direct-cooling module structure is made of Al and has a linear expansion coefficient of 23 ppm; in addition, the semiconductor element 11 is made of SiC and has a linear expansion coefficient of 4.6 ppm.

The greater linear expansion coefficient the insulating substrate 13 has, the smaller difference in linear expansion coefficient between the insulating substrate 13 and the cooler 12. Thus, the joining material 23, located between the insulating substrate 13 and the cooler 12, has smaller stress. However, the greater linear expansion coefficient the insulating substrate 13 has, the greater difference in linear expansion coefficient between the insulating substrate 13 and the semiconductor element 11. Thus, the die-bond material 22 has greater stress resulting from warping in the insulating substrate 13. Consequently, the greater linear expansion coefficient the insulating substrate 13 has, the shorter lifetime the die-bond material 22 has.

Conversely, the smaller linear expansion coefficient the insulating substrate 13 has, the greater stress the joining material 23 has due to warping in the cooler 12, and the smaller stress the die-bond material 22 has. Thus, the die-bond material 22 has a longer lifetime.

As far as improvement in lifetime of the die-bond material 22 is concerned, the semiconductor element 11, when containing SiC for instance, has a linear expansion coefficient of 4.6 ppm, and the insulating substrate 13 favorably has a linear expansion coefficient that is closer to 4.6 ppm. It is noted that the cooler 12, when containing Al for instance, has a linear expansion coefficient of 23 ppm; accordingly, the insulating substrate 13, when having a linear expansion coefficient that is closer to that of the semiconductor element 11, produces a greater difference in linear expansion coefficient between the insulating substrate 13 and the cooler 12, and thus, the joining material 23 has greater stress due to the warping in the cooler 12.

As shown in FIG. 7, trial calculation within a range that does not affect the bonding material 23 has revealed that the difference of the insulating substrate 13 in linear expansion coefficient has a small effect on the heat cycle lifetime of the die-bond material 22.

The graphs have revealed that reducing the thickness t of the semiconductor element 11 improves the lifetime of the die-bond material 22 in each and every linear expansion coefficient of the insulating substrate 13 illustrated in FIG. 7. This is because the thinner the semiconductor element 11 is, the more the semiconductor element 11 presumably tends to follow the warping in the cooler 12, thereby relieving the stress generated in the die-bond material 22. Hence, the thickness of the semiconductor element 11 is desirably reduced in the semiconductor device 101 for improvement in lifetime of the die-bond material 22.

Figure 8:
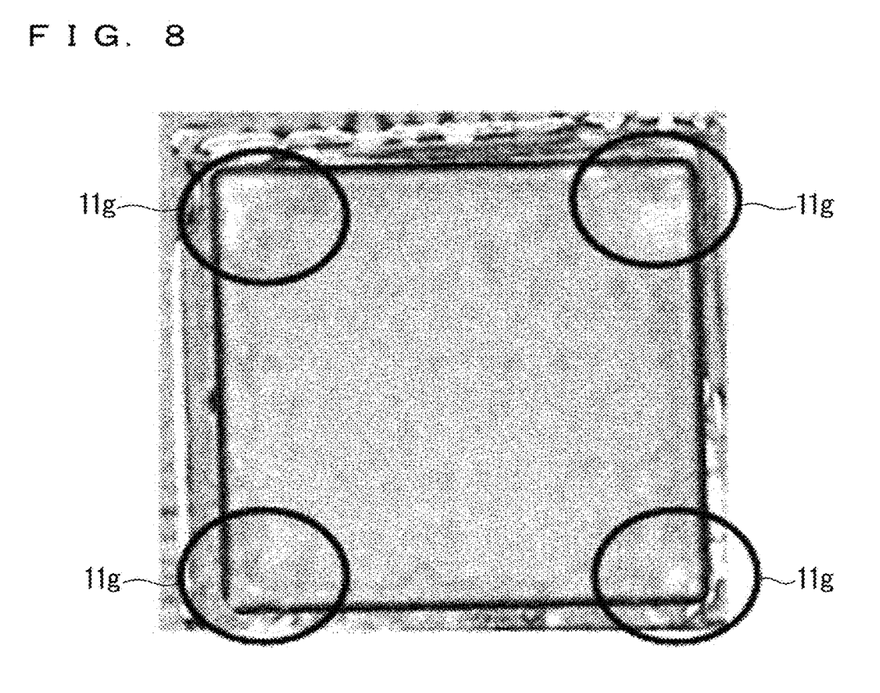
FIG. 8 is a SAT image showing detachment in the die-bond material.

FIG. 8 is a Scanning Acoustic Tomograph (SAT) image showing detachment occurring in the dic-bond material 22. This detachment is caused by a heat cycle test. In this SAT image, the semiconductor device 101 is viewed from the first main surface of the semiconductor element 11. Regions 11g at the corners of the semiconductor element 11 have white portions indicative of a state of detachment. The depth position of the SAT image is set in the position of the die-bond material 22. Accordingly, these white portions reflect the state of detachment of the die-bond material 22. The thickness t of the semiconductor element 11 is desirably reduced in order to improve the number of heat cycles before the occurrence of such detachment in the die-bond material 22.

As seen from FIG. 7, when the thickness t is 100 μm, the heat cycle lifetime is about 3000 to 7000 cycles; when the thickness t is 200 μm, about 400 to 600 cycles; and when the thickness t is 300 μm, about 200 to 300 cycles. That is, the heat cycle lifetime of the die-bond material 22 more improves by the order of one digit in a thickness t of 100 μm than in thicknesses t of 200 μm and 300 μm. In contrast to this, the heat cycle lifetime of the die-bond material 22 more improves by only the order of double in a thickness t of 200 μm than in a thickness t of 300 μm.

As such, the semiconductor element 11 desirably has a thickness t of 100 μm or less in order to remarkably improve the heat cycle lifetime. On the other hand, the semiconductor element 11 desirably has a thickness t of 50 μm or greater in view of yield in manufacturing processes. Accordingly, a desirable range of the thickness t of the semiconductor element 11 is 50 μm or more and 100 μm or less (i.e., 0.05 mm or more and 0.1 mm or less).

To follow the warping in the cooler 12, the semiconductor element 11 needs to withstand stress applied to itself. Accordingly, the following describes a desirable range of bending strength in the semiconductor element 11.

The semiconductor element 11 undergoes 1000 cycles of the heat cycle test as described with reference to FIG. 7. In this case, the semiconductor element 11, when having a bending strength degree of from 100 Mpa to less than 700 MPa, has cracking from an edge of the chip. On the other hand, the semiconductor element 11, when have a bending strength degree of 700 MPa or more, has no such cracking. As such, the semiconductor element desirably has a bending strength degree of 700 MPa or more.

Figure 9:
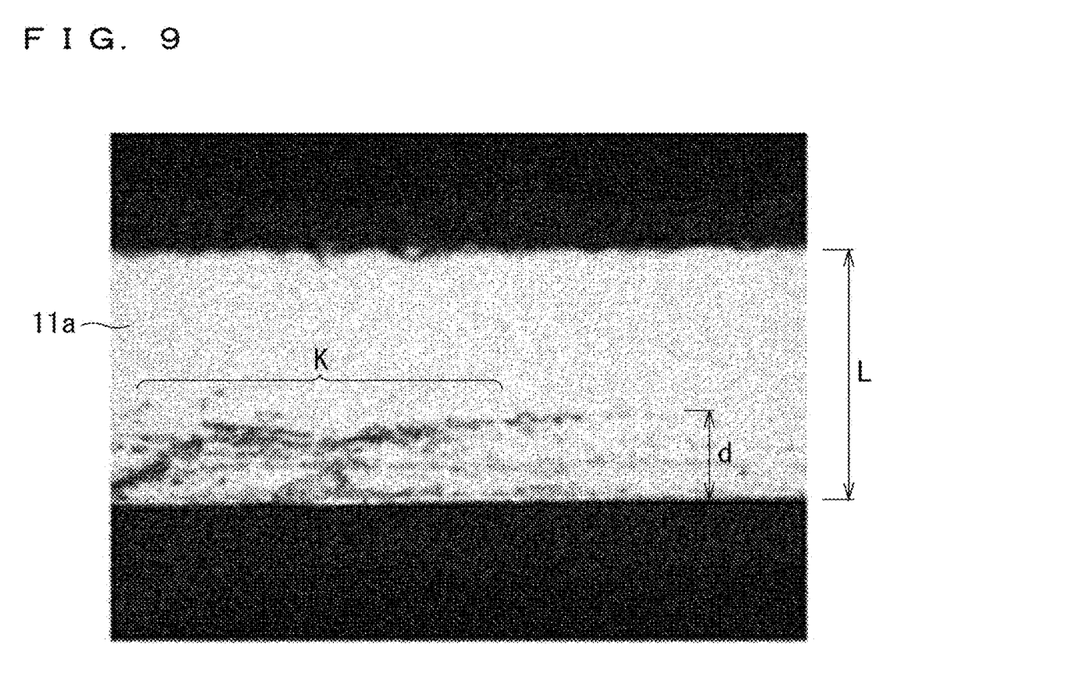
FIG. 9 is a cross-sectional image of a semiconductor element 11 after dicing viewed from a microscope.
Figure 10:
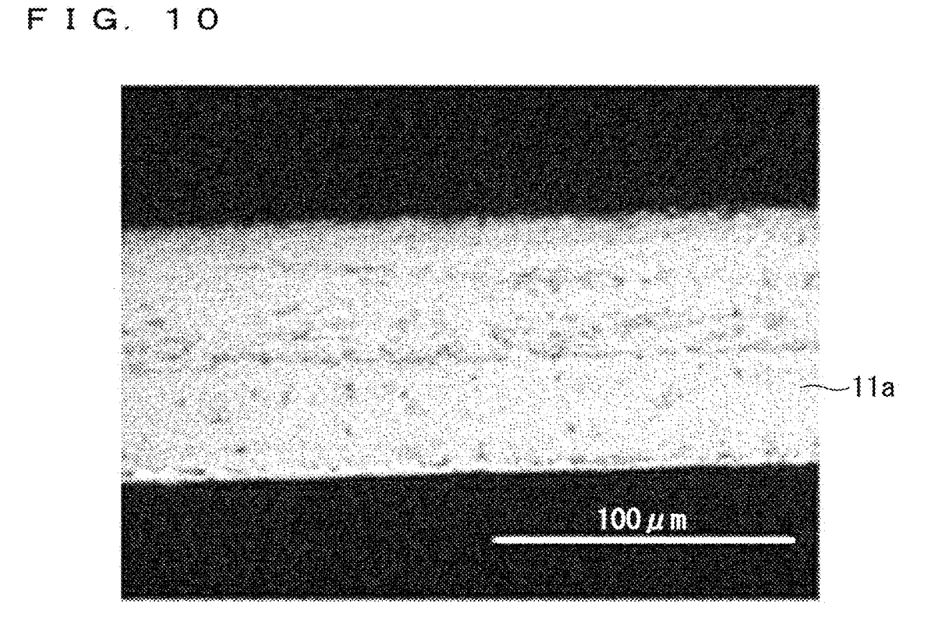
FIG. 10 is a cross-sectional image of the semiconductor element 11 after dicing viewed from the microscope.

The bending strength of the semiconductor element 11 relies on processes for manufacturing the semiconductor element 11 and its thickness t. In particular, conditions of dicing the semiconductor elements 11 are important parameters. FIGS. 9 and 10 are cross-sectional images of the semiconductor element 11 after diced viewed through a microscope. It is noted that conditions of dicing are different from each other between a sample in FIG. 9 and a sample in FIG. 10.

FIG. 9 shows a crack K at the edge. This crack K triggers cracking in bending-strength evaluation. The crack K is thus unfavorable for improvement in bending strength.

FIG. 10 shows no cracks. The semiconductor element 11 with no cracks reduces triggers that lead to destruction in the bending-strength evaluation. That is, the semiconductor device 101 including the semiconductor element 11 has high productivity. The sample in FIG. 10 is more desirable than the sample in FIG. 9 for improved bending strength.

That is, dicing is desirably performed in a condition of dicing that involves no cracks. Specifically, improvement in conditions of dicing is achieved by proper selection of types and thicknesses of blade used in dicing, types of dicing tape per se, and types of adhesive contained in the dicing tape.

For instance, it is desirable that the blade have a small thickness. Such a small thickness reduces additional cracks produced in dicing. It is also desirable that the adhesive contained in the dicing tape desirably have high adhesion. Such high adhesion prevents its target object (herein, the semiconductor element 11) from being deformed by stress generated in dicing using the blade.

Figure 11:
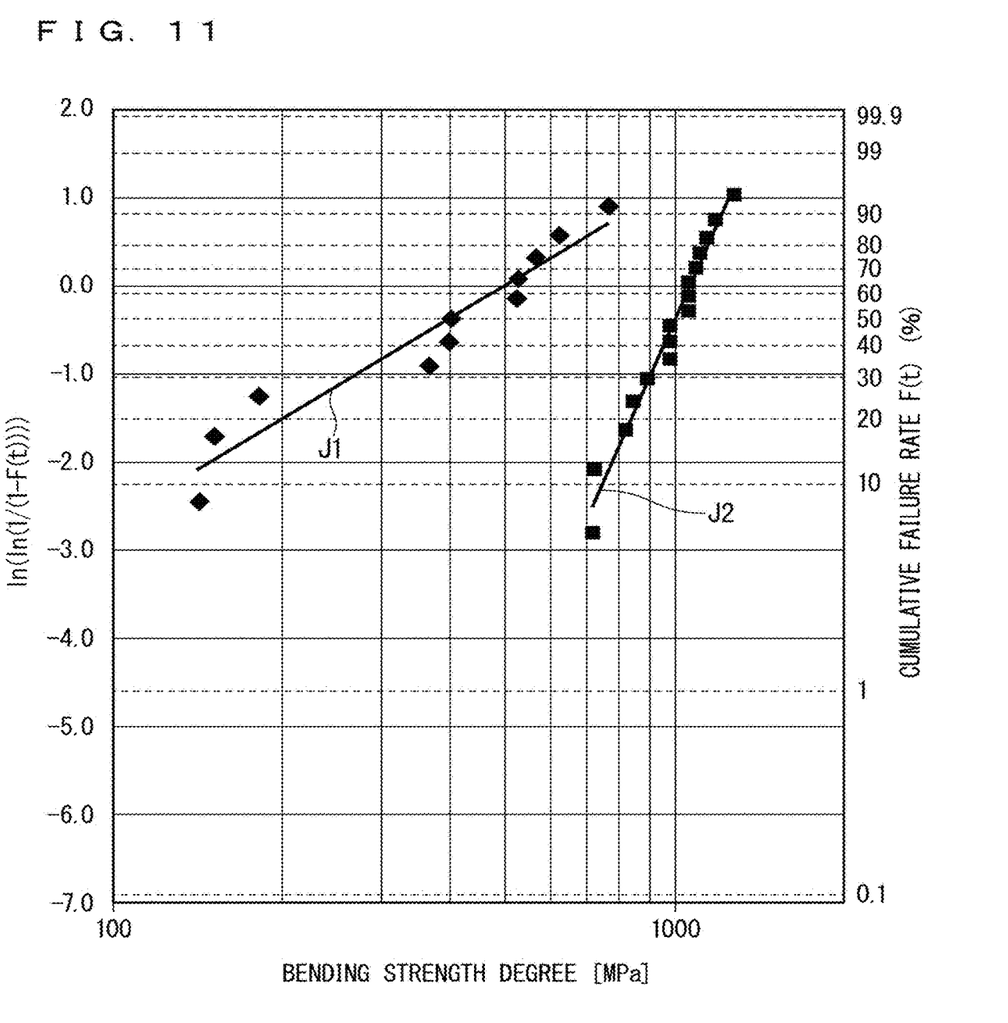
FIG. 11 illustrates graphs showing relationships between cumulative failure rates and bending strength degrees of the semiconductor element.

FIG. 11 illustrates graphs showing relationships between the cumulative failure rate and bending strength of the semiconductor element 11, and illustrates graphs using a so-called Weibull plot. A right vertical axis denotes cumulative failure rates, F(t), of the semiconductor element 11 on a percentage basis. A left vertical axis denotes values ln (ln(1/(1−F(t)))), where a symbol ln represents a natural logarithm, where a symbol t in the symbol F(t) represents time. A horizontal axis in FIG. 11 denotes bending strength degrees of the semiconductor element 11 in the unit Mpa.

It is noted that a MOSFET made of SiC is used as the semiconductor element 11, and the thickness t of the semiconductor element 11 is 100 μm. The bending strength degrees are obtained through a three-point bending strength test. FIG. 11 shows regression lines J1 and J2 respectively indicating the semiconductor element 11 produced in a first condition of dicing and the semiconductor element 11 produced in a second condition of dicing different from the first condition of dicing.

The thickness of the blade is smaller and the adhesive contained in the dicing tape has higher adhesion in the second condition of dicing than in the first condition of dicing. As indicated by the regression line J1, the semiconductor element 11 produced in the first condition of dicing has a bending strength degree of about 100 to 800 MPa. As indicated by the regression line J2, the semiconductor element 11 produced in the second condition of dicing has a bending strength degree of about 700 to 1100 MPa. As seen from the above, the second condition of dicing more tends to achieve the semiconductor element 11 having high bending strength than the first condition of dicing. In addition, the difference between the regression lines J1 and J2 clarifies that the second condition of dicing involves smaller variation in bending strength degree than the first condition of dicing.

Figure 12:
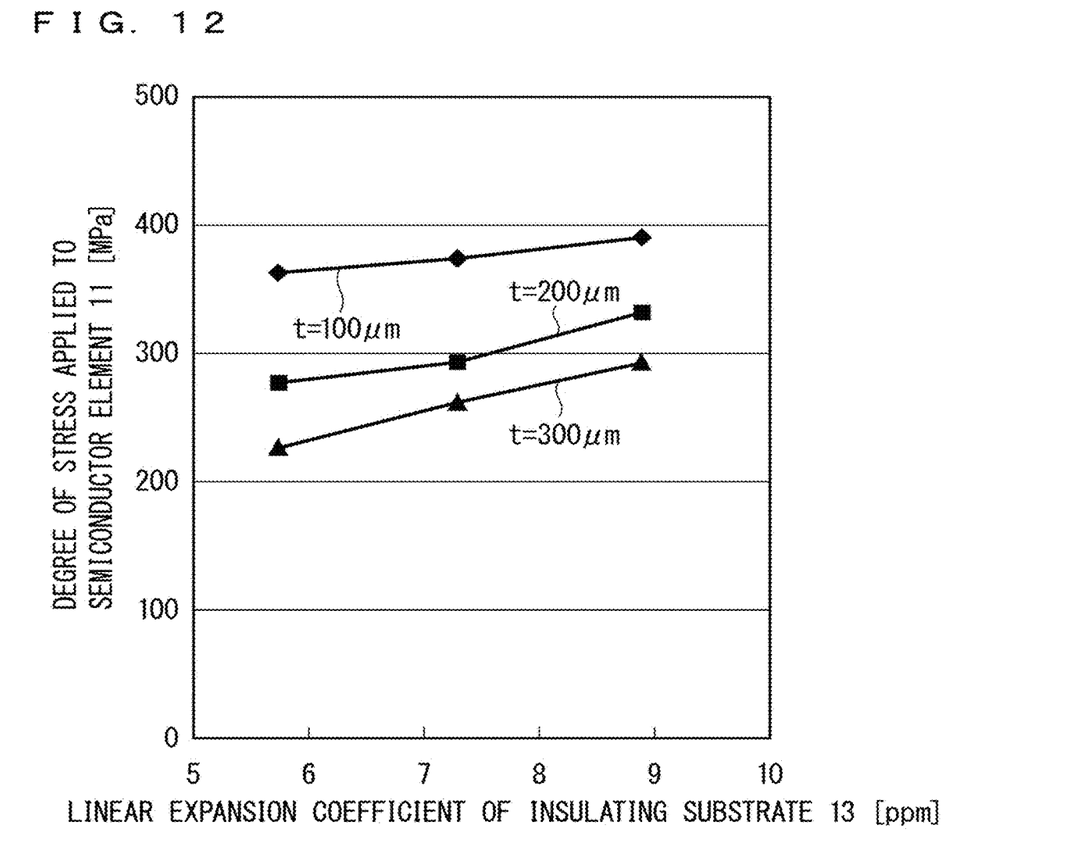
FIG. 12 illustrates graphs showing degrees of stress applied to the semiconductor element in the semiconductor device.

FIG. 12 illustrates graphs showing degrees of stress in a thickness direction (vertical stress) applied to the semiconductor element 11 in the semiconductor device 101. These graphs are the results of calculation performed by computer aided engineering (CAE). A vertical axis indicates values of the stress applied to the semiconductor element 11. A horizontal axis indicates values of the linear expansion coefficient of the insulating substrate 13 joined to the semiconductor element 11 through the die-bond material 22. It is noted that the thickness t of the semiconductor element 11 is a parameter, and its values are 100 μm, 200 μm, and 300 μm.

The calculation results in FIG. 12 have revealed that the value of stress applied to the semiconductor element 11 are less than 400 MPa with respect to the linear expansion coefficient of the insulating substrate 13 in any thickness t of the semiconductor element 11. Accordingly, the semiconductor element 11, when having a bending strength degree of less than 400 Mpa, presumably has cracking; in addition, the semiconductor element 11, when having a bending strength degree of 400 MPa or more, presumably has no defects.

The calculation results in FIG. 12 are consistent with the fact that the semiconductor element 11, when having a bending strength degree of 700 Mpa or more, has no defects, such as cracking, even in 1000 cycles of the heat cycle test.

The calculation results have also revealed that the thinner the thickness t is, the higher stress the semiconductor element 11 receives. In other words, the thinner the thickness t is, the higher bending strength the semiconductor element 11 needs to have. As described with reference to FIG. 7, the thinner the thickness t is, the more the heat cycle lifetime of the die-bond material 22 improves. Further, the semiconductor element 11 with the cumulative failure rates F(t) in the graphs in FIG. 11 has a thickness t of 100 μm. Accordingly, the semiconductor element 11 further desirably has a bending strength degree of 1000 MPa or more in view of manufacture variation.

Figure 13:
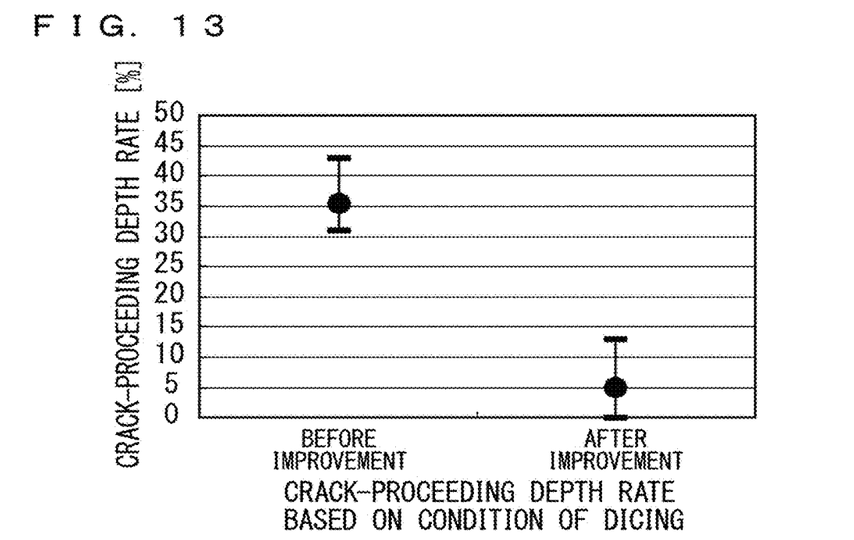
FIG. 13 illustrates graphs showing relationships between conditions of dicing and crack-proceeding depth rates.

FIG. 13 illustrates graphs showing relationships between the conditions of dicing and crack-proceeding depth rates. Each crack-proceeding depth rate indicates the size of a crack produced in the end surface of a chip after dicing. Each crack-proceeding depth rate is defined, with reference to FIG. 9, as a ratio of the depth, d, of the crack to the thickness, L, of the chip on a percentage basis (100×d/L[%]). Expressions "before improvement" and "after improvement" in FIG. 13 respectively correspond to the first condition of dicing and the second condition of dicing.

As seen from FIG. 13, the crack-proceeding depth rates are lower in the second condition of dicing than in the first condition of dicing. The crack-proceeding depth rates are over 30% in the first condition of dicing, which involves a reduction in strength in FIG. 11. Accordingly, for improved strength, the crack-proceeding depth rate needs to be 30% or less.

The semiconductor device 101 absorbs, in the semiconductor element 11, the thermal stress resulting from the difference between the linear expansion coefficient of the semiconductor element 11 and the thermal expansion coefficient of the cooler 12. This relieves the stress generated in the joining material 23. Consequently, the semiconductor device 101 having high heat conductivity, high productivity, and high reliability is achieved. In addition, the lower limit in thickness of the semiconductor element 11 does not deteriorate the yield of the semiconductor element 11 in manufacturing processes, thereby involving no obtrusive increase in cost.

Second Embodiment

Figure 14:
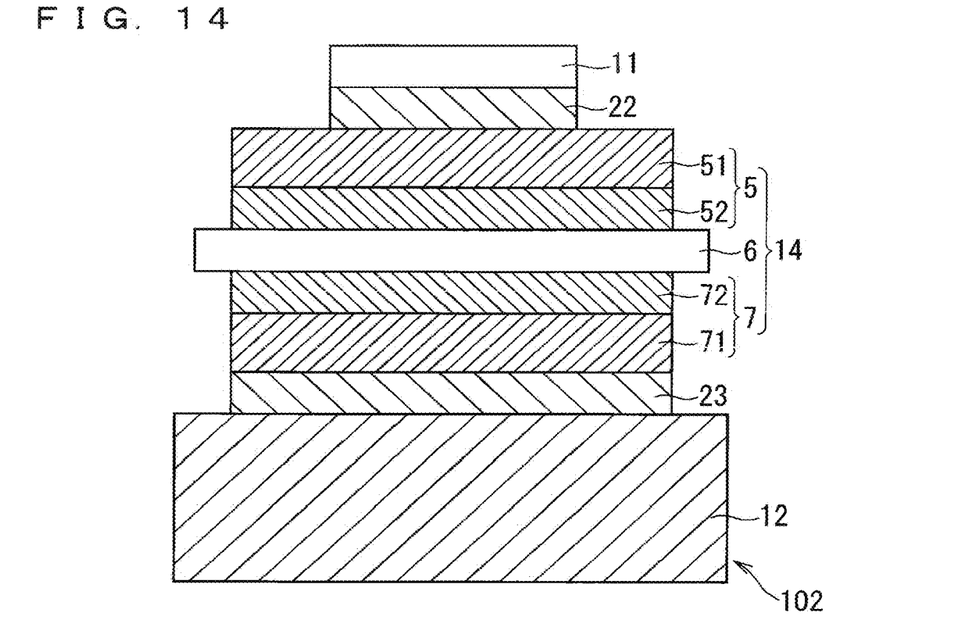
FIG. 14 is a cross-sectional view of the structure of a semiconductor device according to a second embodiment.

FIG. 14 is a cross-sectional view of the structure of a semiconductor device 102 according to a second embodiment. In contrast to the structure of the semiconductor device 101 in the first embodiment, the semiconductor device 102 has a structure in which the insulating substrate 13 is replaced with an insulating substrate 14. The other components are the same as those of the semiconductor device 101. It is noted that this drawing does not distinctively illustrate the semiconductor base 11a, the wiring electrode 11b, and the back-surface external-output electrode 11c, in the semiconductor element 11.

The insulating substrate 14 has the insulating ceramic 6, copper plates 51 and 71, aluminum plates 52 and 72. The copper plates 51 and 71 are made of copper. The aluminum plates 52 and 72 are made of aluminum.

The aluminum plates 52 and 72 are in contact with the insulating ceramic 6. The copper plate 51 and the copper plate 71 are respectively in contact with the aluminum plate 52 and the aluminum plate 72. The aluminum plate 52 is sandwiched between the insulating ceramic 6 and the copper plate 51. The aluminum plate 72 is sandwiched between the insulating ceramic 6 and the copper plate 71. The copper plate 51 is joined to the semiconductor element 11 through the die-bond material 22. The copper plate 71 is joined to the cooler 12 through the joining material 23.

Accordingly, the copper plate 51 and the aluminum plate 52, as a whole, can be regarded as the conductive plate 5 following the first embodiment. Likewise, the copper plate 71 and the aluminum plate 72, as a whole, can be regarded as the conductive plate 7 following the first embodiment.

As described above, the conductive plate 7 has a stacked structure of copper, which has high heat conductivity, and aluminum, which is susceptible to plastic deformation. Such a conductive plate 7 improves the reliability of a joint between the insulating substrate 14 and the cooler 12 when compared to a conductive plate 7 of copper alone. This improvement is suitable to form the cooler 12 using aluminum. This is because thermal stress is uniformly applied to the members sandwiching the joining material 23, i.e., the cooler 12 and the conductive plate 7. Such an effect is remarkably seen particularly when the joining material 23 is made of solder.

It is desirable that the aluminum plate 72 be made of pure aluminum at least having a purity degree of 99.5% or more, and preferably having a purity degree of 99.9% or more. This enables the linear thermal-expansion coefficient of the insulating substrate 14 as a whole to be close to the liner thermal-expansion coefficient of aluminum, thereby reducing stress acting on the joining material 23. Such a reduction in stress is desirable for improved reliability of a joint between the insulating substrate 14 and the cooler 12. It is also desirable that the aluminum plate 52 be made of pure aluminum at least having a purity degree of 99.5% or more, and preferably having a purity degree of 99.9% or more, in order for the linear thermal expansion coefficient of the insulating substrate 14 as a whole to be close to the liner thermal expansion coefficient of aluminum.

Figure 15:
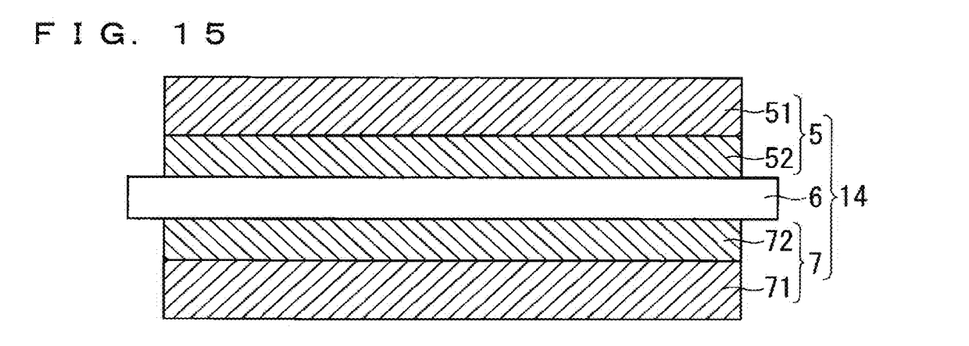
FIG. 15 is a cross-sectional view of one of sequential steps for manufacturing the semiconductor device according to the second embodiment.
Figure 16:
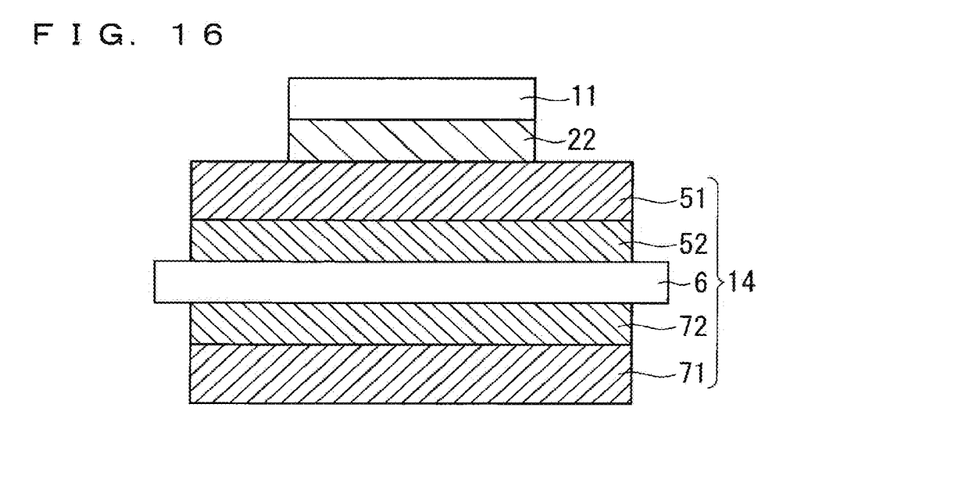
FIG. 16 is a cross-sectional view of another one of sequential steps for manufacturing the semiconductor device according to the second embodiment.

FIGS. 15 and 16 are cross-sectional views of sequential steps for manufacturing the semiconductor device 102. Referring to FIG. 15, at first, the insulating substrate 14 is prepared. The term "prepared" herein means that the insulating substrate 14 is prepared, which includes an insulating plate, which in this embodiment is the insulating ceramic 6, and the conductive plates 5 and 7 disposed on both surfaces of the insulating ceramic 6, and does not necessarily mean the production of the insulating substrate 14. The cooler 12 is also prepared at this stage, which is not shown.

FIG. 16 illustrates a step of placing the semiconductor element 11 to the insulating substrate 14 (more specifically, to the copper plate 51) through the die-bond material 22. Then, through the joining material 23, the cooler 12 is joined to the copper plate 71 in the insulating substrate 14. The copper plate 71 is on a side that is opposite to the side on which the semiconductor element 11 is placed. This obtains the configuration illustrated in FIG. 14.

Third Embodiment

Figure 17:
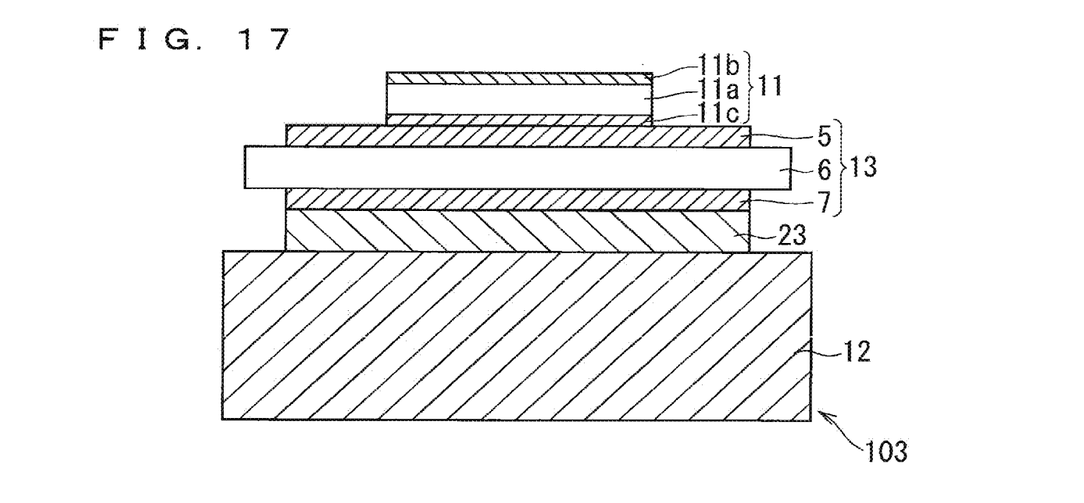
FIG. 17 is a cross-sectional view of the structure of a semiconductor device according to a third embodiment.

FIG. 17 is a cross-sectional view of the structure of a semiconductor device 103 according to a third embodiment. In contrast to the semiconductor device 101 according to the first embodiment, the semiconductor device 103 has a configuration in which both of the back-surface external-output electrode 11c and the conductive plate 5 are made of copper and the die-bond material 22 is not included. That is, the back-surface external-output electrode 11c and the conductive plate 5 are joined to each other without the die-bond material 22. The other components are the same as those of the semiconductor device 101.

In such a configuration, the back-surface external-output electrode 11c and the conductive plate 5 are joined to each other through liquid phase diffusion bonding or solid phase diffusion bonding. The joining in such an aspect improves resistance against stress. This improves the reliability of a joint between the insulating substrate 13 and the semiconductor element 11.

Figure 18:
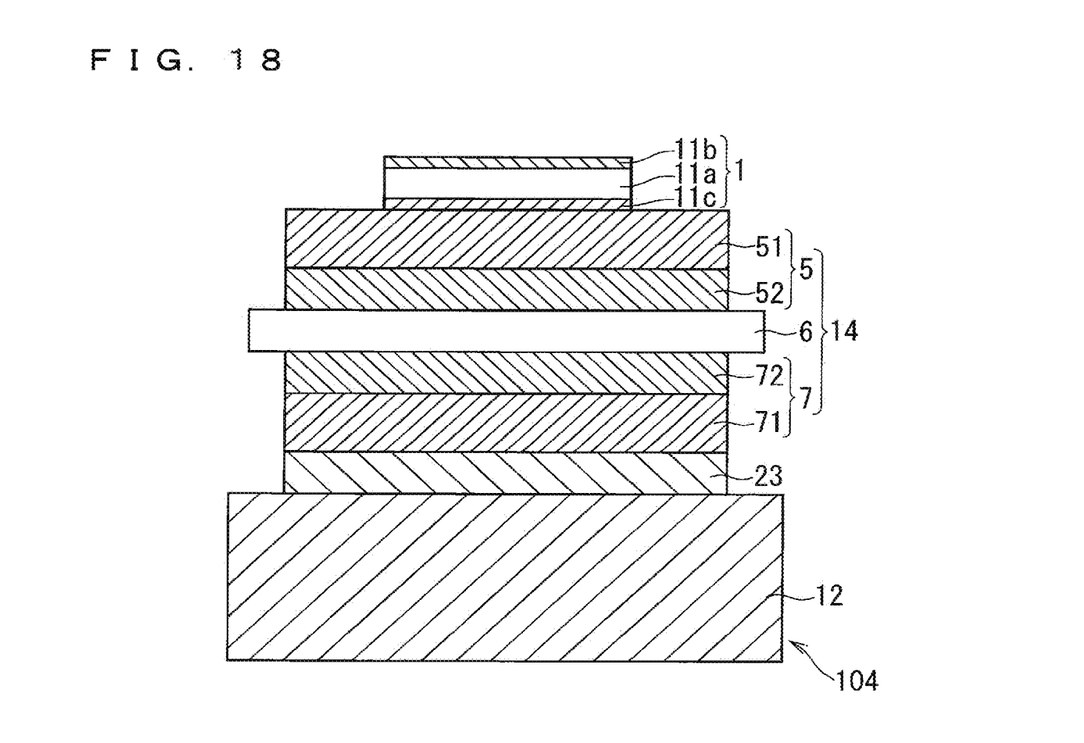
FIG. 18 is a cross-sectional view of the structure of another semiconductor device according to the third embodiment.

FIG. 18 is a cross-sectional view of the structure of another semiconductor device 104 according to the present embodiment. In contrast to the semiconductor device 102 according to the second embodiment, the semiconductor device 104 has a configuration in which the back-surface external-output electrode 11c is made of copper and the die-bond material 22 is not included. That is, the back-surface external-output electrode 11c and the copper plate 51 are joined to each other without the die-bond material 22. The other components are the same as those of the semiconductor device 102.

In such a configuration, the back-surface external-output electrode 11c and the copper plate 51 are joined to each other through liquid-phase diffusion bonding or solid-phase diffusion bonding. The joining in such an aspect improves resistance against stress. This improves the reliability of a joint between the insulating substrate 14 and the semiconductor element 11.

For instance, a so-called Direct Bonded Copper method for forming the conductive plate 5 of the insulating substrate 13 or the copper plate 51 of the insulating substrate 14, enables the semiconductor element 11 to be joined to the insulating substrate 13 or the semiconductor element 11 to be joined to the insulating substrate 14 through solid phase diffusion bonding or liquid phase diffusion bonding.

As a matter of course, the semiconductor element 11 may be joined to the insulating substrate 13 through the die-bond material 22 with the back-surface external-output electrode 11c and the conductive plate 5 made of copper. The conductive plate 7 may be made of copper as well.

Fourth Embodiment

Figure 19:
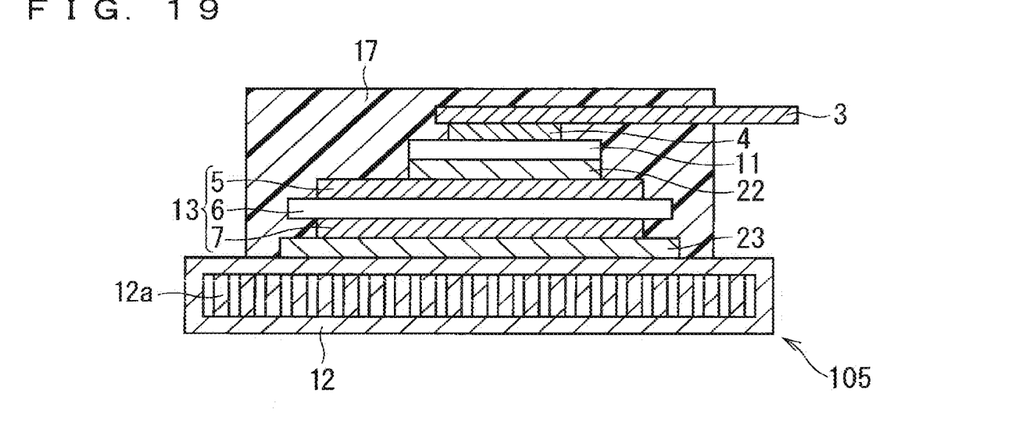
FIG. 19 is a cross-sectional view of the structure of a semiconductor device according to a fourth embodiment.

FIG. 19 is a cross-sectional view of the structure of a semiconductor device 105 according to a fourth embodiment. In contrast to the semiconductor device 101 described in the first embodiment, the semiconductor device 105 additionally includes a lead 3, a joining material 4, and a sealing resin 17. It is noted that the cooler 12 in the present embodiment has heat dissipation fins 12a. It is also noted that this drawing does not distinctively illustrate the semiconductor base 11a, the wiring electrode 11b, and the back-surface external-output electrode 11c, in the semiconductor element 11.

The joining material 4 is joined to the semiconductor element 11 so as to be remote from the die-bond material 22 (i.e., the joining material 4 is joined to the first main surface). The lead 3 is joined to the semiconductor element 11 through the joining material 4. The scaling resin 17 is disposed on the cooler 12, and seals the lead 3, the joining material 4, the semiconductor element 11, the insulating substrate 13, the die-bond material 22, and the joining material 23.

With such a configuration, the semiconductor device 105 is operable under a temperature of above 175° C. while including the semiconductor element 11 made of SiC. In addition, such a configuration reduces thermal resistance between the semiconductor element 11 and the cooler 12, thereby miniaturizing the semiconductor device 105 and thus enlarging general versatility. This contributes to the miniaturization of, for instance, an inverter including the semiconductor device 105.

Figure 20:
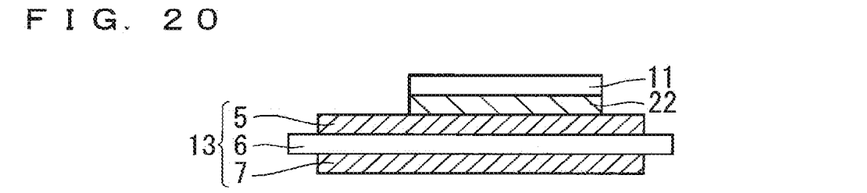
FIGS. 20 to 22 are cross-sectional views of one of sequential steps for manufacturing the semiconductor device according to the fourth embodiment.
Figure 21:
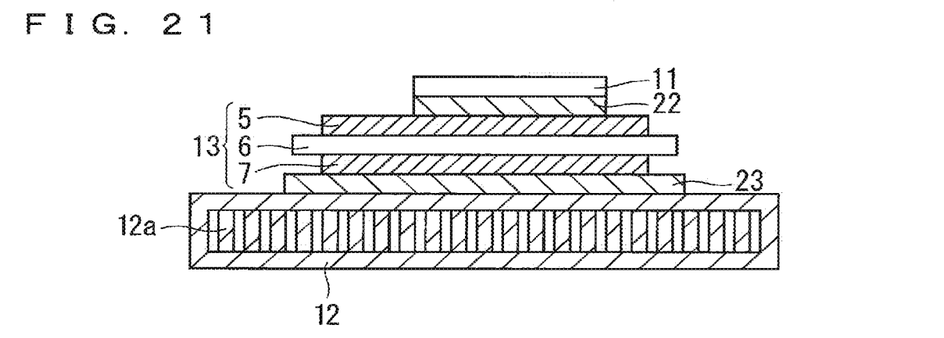
Figure 22:
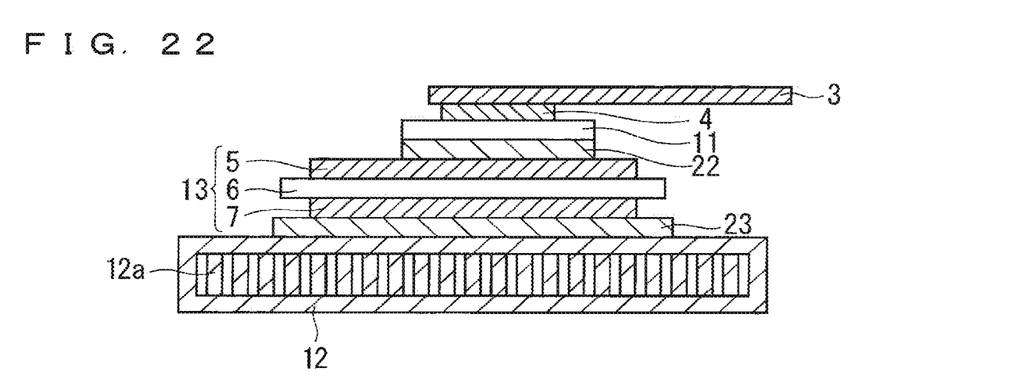

FIGS. 20 to 22 are cross-sectional views of sequential steps for manufacturing the semiconductor device 105 according to the present embodiment. At first, the insulating substrate 13 is prepared, which is formed of the conductive plates 5 and 7 and the insulating ceramic 6 as previously integrated with each other. Next, the second main surface of the semiconductor element 11 is joined to the conductive plate 5 through the die-bond material 22 (c.f., FIG. 20).

Further, the cooler 12 is joined to the conductive plate 7 through the joining material 23 (c.f., FIG. 21). Subsequently, the joining material 4 is joined to the first main surface of the semiconductor element 11, and further the lead 3 is joined to the joining material 4 on a side opposite to the side on which the semiconductor element 11 is disposed (c.f., FIG. 22). Then, the sealing resin 17 is disposed. Through these process steps, the configuration illustrated in FIG. 19 is achieved. In other words, these process steps contribute to the achievement of the semiconductor device 105.

It is noted that in the present invention, the individual embodiments can be freely combined, or can be modified and omitted as appropriate, within the scope of the invention.

In the embodiments, the materials and qualities of material of the individual components, performance conditions, and other things are illustrative and not restrictive.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 3 lead, 4, 23 joining material, 5, 7 conductive plate, 6 insulating ceramic, 11 semiconductor element, 11a semiconductor base, 12 cooler, 13, 14 insulating substrate, 17 sealing resin, 22 die bond, 51, 71 copper plate, 52, 72 aluminum plate, 101 to 105 semiconductor device.

The invention claimed is:

1. A semiconductor device comprising:
    an insulating substrate comprising an insulating plate, a first conductive plate disposed on one surface of the insulating plate, and a second conductive plate disposed on another surface of the insulating plate;
    a sintered metal;
    a semiconductor element disposed on the first conductive plate through the sintered metal, the semiconductor element having a crack-proceeding depth rate of 30% or less of a chip thickness, and having a thickness of 0.05 mm or more and 0.1 mm or less;
    a joining material; and
    a cooler joined to the second conductive plate through the joining material.

2. The semiconductor device according to claim 1, wherein the sintered metal has a thickness of 3 μm or more and 100 μm or less.

3. The semiconductor device according to claim 2, wherein the semiconductor element comprises a semiconductor base made of SiC.

4. The semiconductor device according to claim 1, wherein the insulating plate is made of silicon nitride, aluminum nitride, or alumina.

5. The semiconductor device according to claim 4, wherein the semiconductor element comprises a semiconductor base made of SiC.

6. The semiconductor device according to claim 1, wherein the second conductive plate comprises a stacked structure of copper or an alloy of copper, and aluminum or an alloy of aluminum.

7. The semiconductor device according to claim 6, wherein the semiconductor element comprises a semiconductor base made of SiC.

8. The semiconductor device according to claim 1, wherein the cooler is made of aluminum or an alloy of aluminum.

9. The semiconductor device according to claim 8, wherein the semiconductor element comprises a semiconductor base made of SiC.

10. The semiconductor device according to claim 1, wherein the semiconductor element comprises a semiconductor base made of SiC.

11. A method for manufacturing a semiconductor device, comprising:
    (a) preparing an insulating substrate comprising an insulating plate, a first conductive plate disposed on one surface of the insulating plate, and a second conductive plate disposed on another surface of the insulating plate;
    (b) disposing a semiconductor element to the first conductive plate through a sintered metal, the semiconductor element having a thickness of 0.05 mm or more and 0.1 mm or less, and having a crack-proceeding depth rate of 30% or less of the thickness; and
    (c) joining a cooler to the second conductive plate through a first joining material.

12. The method for manufacturing a semiconductor device according to claim 11, further comprising:
    (d) joining, through a second joining material, a lead to the semiconductor element on a side that is opposite to a side on which the sintered metal is disposed, and
    (e) sealing the semiconductor element, the insulating substrate, and the lead with a sealing resin.

* * * * *